United States Patent
Wrathall et al.

[11] Patent Number: 5,867,014
[45] Date of Patent: Feb. 2, 1999

[54] CURRENT SENSE CIRCUIT HAVING MULTIPLE PILOT AND REFERENCE TRANSISTORS

[75] Inventors: Robert S. Wrathall, Scotts Valley; Kevin P. D'Angelo, Santa Clara, both of Calif.

[73] Assignee: Impala Linear Corporation, Sunnyvale, Calif.

[21] Appl. No.: 975,324

[22] Filed: Nov. 20, 1997

[51] Int. Cl.[6] ........................................................ G05F 3/20
[52] U.S. Cl. ............................................. 323/316; 323/315
[58] Field of Search .................................. 323/312, 315, 323/316; 330/257, 288

[56] References Cited

U.S. PATENT DOCUMENTS

| | | | |
|---|---|---|---|
| 4,319,181 | 3/1982 | Wrathall | 323/315 |
| 4,553,084 | 11/1985 | Wrathall | 323/316 |
| 4,820,968 | 4/1989 | Wrathall | 323/316 |
| 4,885,477 | 12/1989 | Bird et al. | 323/316 |
| 5,008,586 | 4/1991 | Miyazaki et al. | 323/315 |
| 5,113,089 | 5/1992 | Osawa | 323/316 |
| 5,134,358 | 7/1992 | Agiman | 323/316 |
| 5,144,172 | 9/1992 | Palara et al. | 307/570 |
| 5,245,523 | 9/1993 | Juzswik | 363/56 |
| 5,635,823 | 6/1997 | Murakami et al. | 323/315 |
| 5,646,520 | 7/1997 | Frank et al. | 324/158.1 |
| 5,757,174 | 5/1998 | Ki | 323/315 |

*Primary Examiner*—Matthew Nguyen
*Attorney, Agent, or Firm*—Terry McHugh

[57] ABSTRACT

A current sense circuit utilizes multiple resistive reference switches connected in electrical series to reduce the level of required reference current (Iref), while maintaining the integrity of tracking current (Iout) through a resistive power switch. Typically, all of the reference switches are MOS transistors connected in electrical series. The first embodiment includes establishing a ratio (n) of series reference transistors to series pilot transistors, n>1. In another embodiment, the series connection of reference switches is in parallel with a single reference resistor and is identical to a series connection of a number (NP) of pilot switches. In a third embodiment, the techniques of the first two embodiments are combined (i.e., n>1 and NP>1). The current sense circuit is utilized to monitor output current through a power switch from a circuit load. Each of the pilot and reference switches is fabricated such that conductivity through the power switch would be greater than conductivity through an isolated pilot or reference switch by a scaling factor. In the preferred embodiment, a scaling factor (SF) is established by fabricating the pilot and reference switches to have gate widths that are smaller than the gate width of the power switch, such that Iref=Iout/(SF×n×NP).

18 Claims, 6 Drawing Sheets

CURRENT SENSE CIRCUIT HAVING MULTIPLE PILOT AND REFERENCE TRANSISTORS

TECHNICAL FIELD

The invention relates generally to sense circuits and more particularly to current sense circuits for regulating output current of a circuit load.

BACKGROUND ART

There are numerous applications in which current through a circuit load is to be regulated. Current regulation is used to protect circuitry from being damaged in a short circuit or overload situation. For example, the current through a power transistor of a power supply may be monitored to provide a means for limiting current flow through circuitry powered by the supply.

In its simplest form, a current sense circuit can be provided by connecting a resistor in series with a power switching transistor and monitoring the voltage drop across the resistor. The disadvantage of this monitoring circuit is that the current flow through the resistor increases the power demands placed on the supply. Minimizing power dissipation is particularly important to applications that require battery operation, such as providing power to circuitry of a cellular phone.

Power dissipation as a result of current sensing can be reduced by drawing a set fraction of the output current from the load circuitry and using this sampled current in the sensing circuitry. Briefly, the approach is to sample the current through a large device (i.e., the power transistor) with a small known amount of current through a small "pilot" device. If the two devices are transistors, the ratio of the current through the large device to the current through the pilot device may be set by fabricating the transistors such that the same ratio applies to the gate width of the large device to the gate width of the pilot device. This ratio is referred to as the scaling factor (SF). This approach is utilized in the circuits illustrated in FIGS. 1 and 2 and is described in U.S. Pat. Nos. 4,319,181, 4,553,084 and 4,820,968 to Wrathall, the inventor of the present invention.

With reference to FIG. 1, a power switching transistor 10 is connected in series with a circuit load 12 to provide a path from a first terminal (Vdd) 14 to a second terminal (electrical ground) 16 of a power source. A pilot switching transistor 18 has a source-drain conduction path that is in parallel with the source-drain conduction path of the power switching transistor. Gate electrodes 20 and 22 of the two transistors are connected to a single switch control line 24. A pilot resistor 26 is connected between electrical ground and the source of the pilot switching transistor 18. As will be explained more fully below, the pilot switching transistor and the pilot resistor provide current "mirroring" of the current through the power switching transistor 10. A current generator 28 provides a reference current (Iref) and is connected to electrical ground via a reference resistor 30. A differential amplifier 32 has inputs that are responsive to the voltage drops across the pilot and reference resistors 26 and 30.

Typically, the goal of the current sense circuit of FIG. 1 is to provide current limitation by signaling when the current drop across the pilot resistor 26 is equal to the voltage drop across the reference resistor 30. This will occur approximately at the point at which the output current (Iout) from the circuit load 12 is equal to the reference current times the scaling factor of the gate electrodes (i.e., Iout=Iref×SF). The resistances of the pilot and reference resistors 26 and 30 are substantially equal. In the ideal, the voltage drops across the two resistors are equal and the current through the pilot switching transistor 18 tracks precisely the current through the power switching transistor 10 in ratio of their respective gate widths.

An advantage of the prior art current sense circuit of FIG. 1 is that the use of the scaled pilot switching transistor 18 significantly reduces the power dissipation imposed by current monitoring. Power efficiency can be further enhanced by increasing the resistance of the reference resistor 30. For example, if the resistance value is doubled, the reference current can be reduced by two, which is advantageous in terms of both efficiency and control. However, a limitation of the circuit of FIG. 1 is that it exhibits a significant degree of non-linearity, and the increase in the resistance increases the non-linearity. A small pilot resistance allows the pilot circuitry to more closely resemble the operation of the power switching transistor 10. A minimal resistance places the source of the pilot switching transistor 18 at electrical ground, similar to the source of the power switching transistor. However, as the size of the pilot resistance increases, the voltage at the source of the pilot transistor 18 increases for a given current level. This voltage drop varies as a function of Iout. Consequently, as Iout increases, there is a decreasing gate-to-source potential and a decreasing drain-to-source potential for the pilot transistor. Because the two potentials vary non-proportionally with the corresponding potentials at the power switching transistor 10, the current mirroring is inaccurate.

The linearity of the current sense circuit of FIG. 1 is improved in FIG. 2 by the addition of a reference switching transistor 34 in parallel with the reference resistor 30. The gate width of the reference transistor is equal to the gate width of the pilot transistor 18. As explained fully in U.S. Pat. No. 4,820,968 to Wrathall, the addition of the reference transistor provides compensation for the non-linearities imposed as a result of the pilot resistor 26. The reference current Iref is then proportional to the current through the power switching transistor 10. When the voltages across the pilot resistor 26 and the reference resistor 30 are equal, the current ratio between Iout and Iref is then the ratio of the gate widths of the power switching transistor 10 and the pilot switching transistor 18 (i.e., SF=Iout/Iref). The addition of the reference switching transistor 34 enables the use of large resistor values without adversely affecting the current ratio.

While the circuit of FIG. 2 operates well for its intended purpose, there are concerns regarding its limitations. For circuitry that includes DMOS (double-diffused MOS) transistors, it is difficult to fabricate unit cells smaller than a unit cell of gate width. The price of accuracy is a substantial rise in current. For example, if one ampere were to flow in the circuit load 12 of FIG. 2, and the device scaling factor were 2000 (SF=2000), the reference current would be approximately 500 μA. In many applications, this reference current is unacceptably high.

What is needed is a current sensing circuit that allows further reductions in the amount of reference current for given transistor fabrication techniques and parameters.

SUMMARY OF THE INVENTION

A current sense circuit includes pilot circuitry and includes reference circuitry that utilizes multiple resistive reference switches connected in electrical series to reduce the level of reference current, while maintaining the integrity of tracking current through a resistive power switch. In one embodiment, the pilot circuitry has a single pilot transistor and a pilot resistance, while the reference circuitry has the series connection of reference switches in a parallel arrangement with a reference resistance for which the ratio of the reference resistance to pilot resistance corresponds to the ratio (n) of the number of reference transistors to the number of pilot transistors. The ratio n of reference switches to pilot switches is one factor that determines the current gain provided by the sense circuit. In a second embodiment, the series connection of reference switches is in parallel with a single reference resistor and the number of reference switches corresponds to the number (NP) of resistive pilot switches, where NP>1. The pilot switches are connected in electrical series. The current gain associated with this second embodiment corresponds to the number NP of pilot switches. In a third embodiment, the features of the first and second embodiments are combined to permit even greater reductions in the reference current, so that the ratio n is multiplied by the value NP to determine current gain.

All of the embodiments include a circuit load connected to a first terminal of a voltage source and connected to the power switch to provide a first current path between the circuit load and a second terminal of the voltage source. Typically, the resistive power switch is a MOS transistor having a source-drain conduction path from the circuit load to electrical ground. All of the embodiments include pilot circuitry and reference circuitry. The pilot circuitry is at least one resistive pilot switch and a pilot resistance connected in electrical series to establish a second current path between the circuit load and the second terminal of the voltage source. The first and second current paths have electrical characteristics such that sense current through the second current path is at a generally fixed fraction of current through the power switch. Preferably, the desired electrical characteristics are established by fabricating the pilot switch or switches to have a gate width that is smaller than the gate width of the power switch by a scaling factor (SF). The reference circuitry includes the series connected reference switches and includes a current generator for establishing a reference current.

The power switch is regulated in response to voltages that are proportional to the sense current and the reference current. In the preferred embodiment, the current sense circuit includes a differential amplifier having inputs that are responsive to the sense current through the current pilot circuitry and the reference current through the reference circuitry. As is known in the art, the output of the differential amplifier may be used to limit current through the power switch or to toggle the power switch.

In all of the embodiments, the relationship of the reference current (Iref to the output current (Iout) from the circuit load is such that Iref=Iout/(SF×n×NP). In the first embodiment, there is only one pilot switch (NP=1), but there are a number of switch-resistor parallel arrangements in the reference circuitry (n>1). In the second embodiment, there are equal numbers of reference and pilot switches (n=1), but there is more than one pilot switch (NP>1). In the third embodiment, both n and NP are greater than 1, so that the reduction of reference current is particularly significant. For example, if n=4, NP=4, and SF=2000, then Iref=Iout/32,000 when the sense voltage is equal to the reference voltage.

An advantage of the current sense circuit is that merely by adding circuit elements, i.e., switches and resistors, a low reference current can be established without inducing non-linearity. That is, the power efficiency of the circuit can be increased without rendering the circuit susceptible to error.

DETAILED DESCRIPTION

Figure 1:
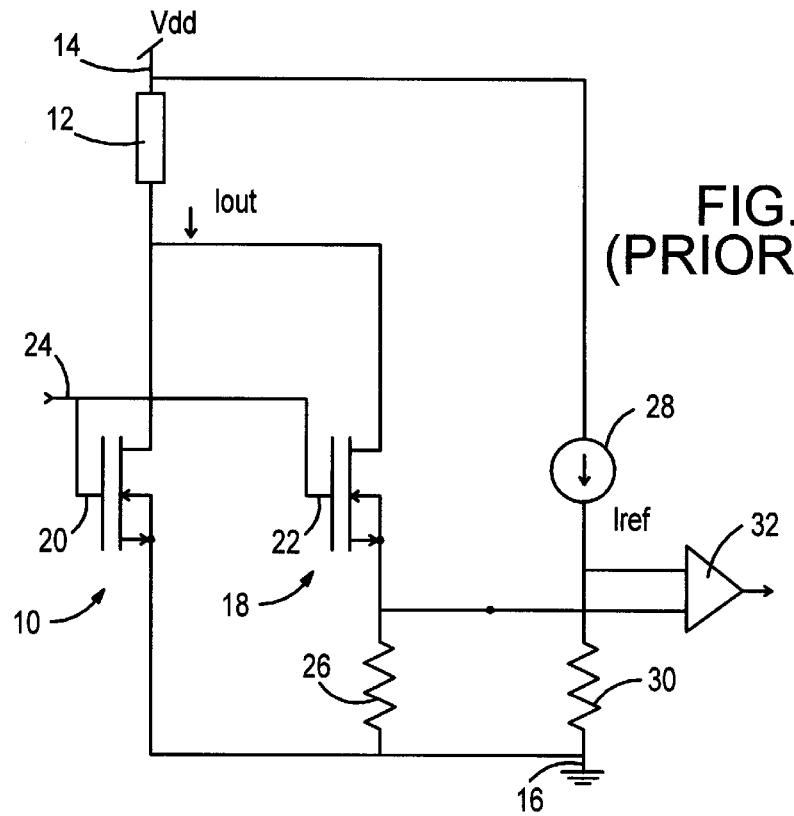
FIG. 1 is a schematic view of a prior art current sense circuit that exhibits non-linearity in operation.
Figure 2:
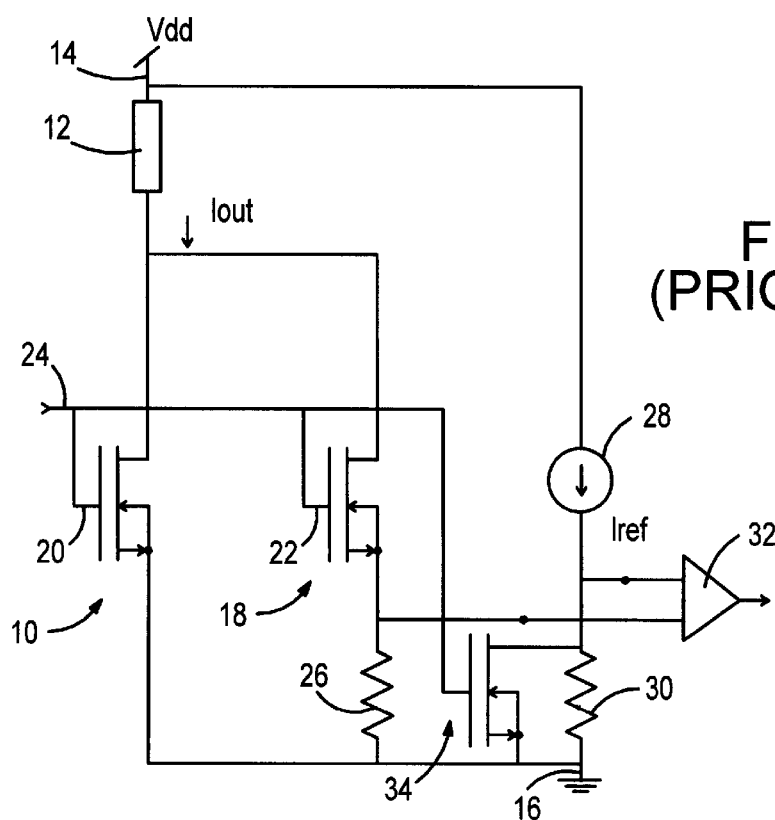
FIG. 2 is a prior art current sense circuit that provides compensation in order to offset the non-linearity of FIG. 1.
Figure 3:
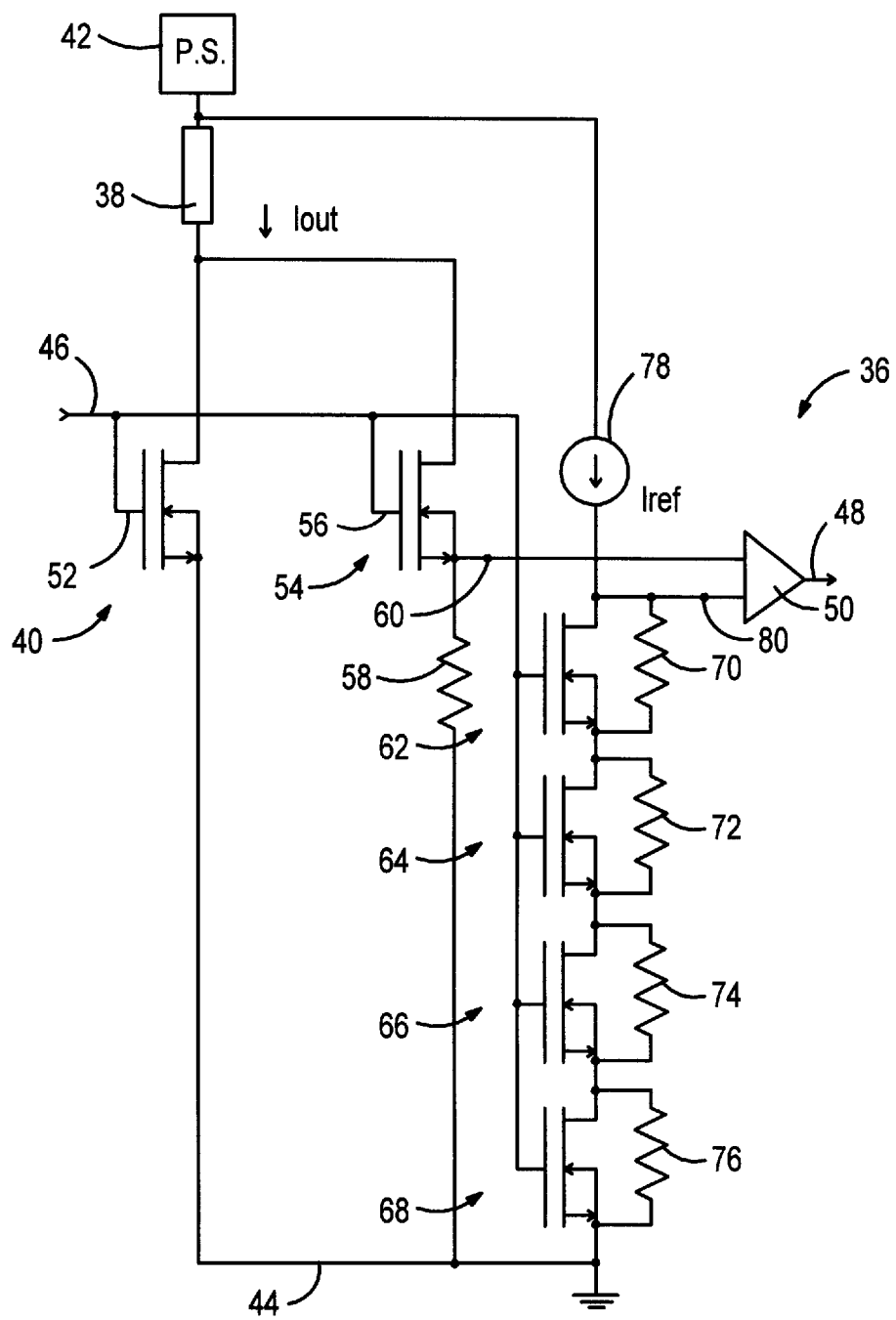
FIG. 3 is a schematic view of a first embodiment of a current sense circuit in accordance with the invention.

With reference to FIG. 3, a first embodiment of a current sense circuit 36 is shown as being connected to monitor current flow (Iout) from a circuit load 38 through a power switch 40. The circuit load is connected to a first terminal of a power supply 42, while the power switch 40 provides a conduction path to the second terminal 44 of the power supply. For example, the first terminal may be a source of Vdd and the second terminal may be electrical ground. The state of the power transistor determines conductivity through the circuit load 38. While not critical, the current sense circuit 36 may be used to generate a control signal along a gate input line 46. For example, an output 48 of a differential amplifier 50 may be tied to the gate input line 46 to provide current limitation through the power switch or to turn the power switch "off" under predetermined conditions.

In the preferred embodiment, the power transistor 40 is a MOS transistor having a source-drain conduction path from the circuit load 38 to electrical ground 44. A gate 52 of the MOS transistor is coupled to the gate input line 46. In the embodiment of FIG. 3, the source-drain conduction path of the power switch is in electrical parallel with a source-drain conduction path of the pilot switch 54. Electrical characteristics of the pilot switch are such that current flow through the pilot switch is equal to a set fraction of the current through the power switch 40. For example, the gate 56 of the pilot switch 54 may have a gate width that is 1/2000 the gate width of gate 52 of the power switch 40. The current through the pilot switch is then approximately 1/2000 the current through the power switch. This significantly reduces the power dissipation generated as a result of the current sensing operation.

A pilot resistor 58 is connected between the pilot switch 54 and electrical ground. The pilot switch and the pilot resistor comprise sense circuitry. Sense current through the pilot transistor "mirrors" the current through the power switch 40, but at the reduced current level. As a result of the pilot resistor 58, the voltage at a first node 60 will be proportional to the sense current. Therefore, the voltage at the first node is indicative of the output current (Iout) from the circuit load 38. This first node is connected to one of the inputs of the differential amplifier 50.

Ideally, the sense current through the sense circuitry (i.e., the pilot switch and resistor 54 and 58) tracks linearly with the current through the power switch 40. However, characteristics of the sense circuitry introduce a degree of non-linearity. The voltage drop across the pilot resistor 58 will vary as a function of Iout. As Iout increases, there is a decreasing gate-to-source potential and a decreasing drain-to-source potential for the pilot switch. On the other hand, there is no resistor between the power switch 40 and electrical ground, so that the two switches 40 and 54 will not exhibit proportional gate-to-source potentials or drain-to-source potentials. To compensate for the non-linearity, the current sense circuit 36 includes reference circuitry, as will be explained immediately below.

The reference circuitry has four reference switches 62, 64, 66 and 68, with each switch being associated with a different reference resistor 70, 72, 74 and 76. Each reference switch is in parallel with its associated reference resistor and in series with the other reference switches. The string of switch-resistor connections is coupled to a current generator 78 for establishing a reference current (Iref). Between the current generator 78 and the string of switch-resistor connections is a second node 80 that provides the second input to the differential amplifier 50.

In the embodiment of FIG. 3, the reference switches 62–68 are MOS transistors having substantially identical electrical characteristics to each other and to the pilot switch 54. Thus, in this embodiment, each reference switch has a gate width that is a known fraction of the gate width of the power switch, e.g., 1/2000. Each of the reference resistors 70–76 has an impedance identical to the impedance of the pilot resistor 58.

The ratio (n) of the number of reference switches 62–68 in the reference circuitry to the number of pilot switches 54 in the pilot circuitry determines the reduction of Iref relative to conventional circuitry which includes only one reference transistor and one pilot transistor. In the current sense circuit 36 of FIG. 3, n=4 so that the reference current is reduced by 400%. Stated in the positive, the current gain from Iref to Iout is a multiplication by 4.

In the operation of the current sense circuit 36 of FIG. 3, the state of the power switch 40 determines conductivity through the circuit load 38. Sense current through the pilot switch 54 will be the current through the power switch 40 divided by the scaling factor (SF) of the two switches. A corresponding voltage will be generated at the first node 60. In order to generate a comparable voltage, the reference current need only be at a level that satisfies the condition Iref=Iout/(SF×n). If the scaling factor is 2000, the four switch-resistor pairs within the reference circuitry increase the current gain by 400%. Instead of 500 $\mu$A flowing through the reference circuitry, only 125 $\mu$A flows as Iref. The effects of non-linearity are canceled, allowing accurate reflection of the reference current to the current through the power transistor 40.

Figure 4:
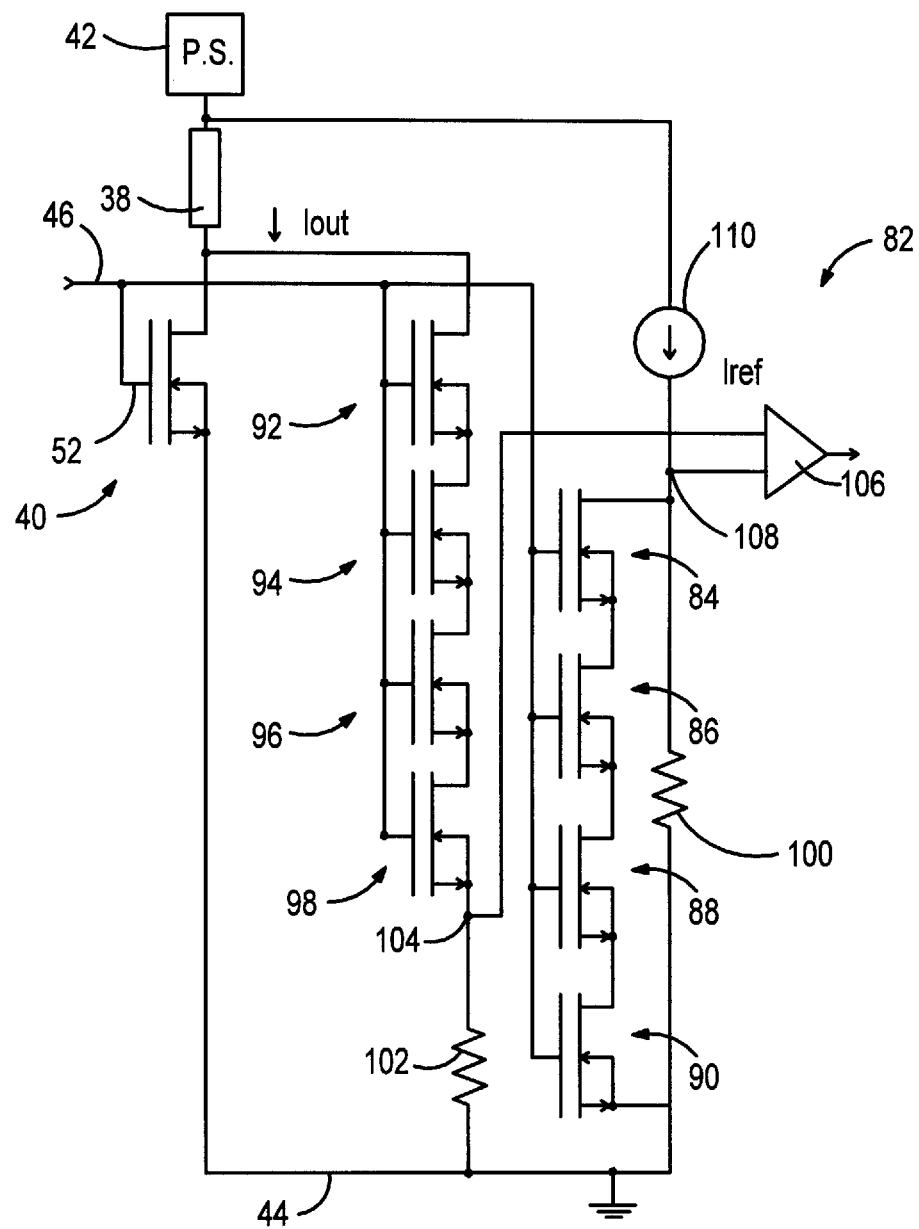
FIG. 4 is a schematic view of a second embodiment of a current sense circuit in accordance with the invention.

FIG. 4 illustrates a second embodiment of a current sense circuit 82 that includes multiple reference switches 84, 86, 88 and 90 connected in series. However, the series connection of reference switches in the second embodiment is designed to duplicate a series connection of pilot switches 92, 94, 96 and 98. The series of four reference switches is in parallel with reference resistor 100 having the same value as a pilot resistor 102 that is in series with the pilot switches. Since the reference circuitry includes the same number of transistors as the pilot circuitry, n=1. The reference switches are identical to each other and to the pilot switches, so that each of the eight switches has the same SF relative to the power switch 40, e.g., SF=2000. Because the power switch, the circuit load 38 and the power supply 42 are functionally equivalent to the same components of FIG. 3, the reference numerals have been duplicated in FIG. 4.

In operation, the impedance imposed by the switch components within the pilot circuitry is four times greater than the impedance imposed by the conventional single pilot switch arrangement. Consequently, the current through the pilot switches 92–98 is only 25% of sense current of the conventional circuits. A voltage is developed at a first node 104 in proportion to the sense current. The voltage at the first node is an input to a differential amplifier 106. The other input to the differential amplifier is the voltage at a second node 108 that represents the voltage drop across the reference resistor 100. A current generator 110 is required to provide only 25% of the "conventional" current in order to match the sense current at the first node 104. Thus, the current gain is increased by a factor of four relative to sense circuits having only one pilot switch and one reference switch.

While the pilot circuitry of FIG. 4 shows four pilot switches 92–98 and the reference circuitry includes four reference switches 84–90, this is not critical. There may be only two pilot switches and two reference switches. However, the greater the number (NP) of pilot switches, the greater the current gain, since Iref=Iout/(SF×n×NP). In FIG. 4, n=1 and NP=4. Consequently, the current gain is equivalent to the current gain exhibited by the embodiment of FIG. 3, where n=4 and NP=1.

Figure 5:
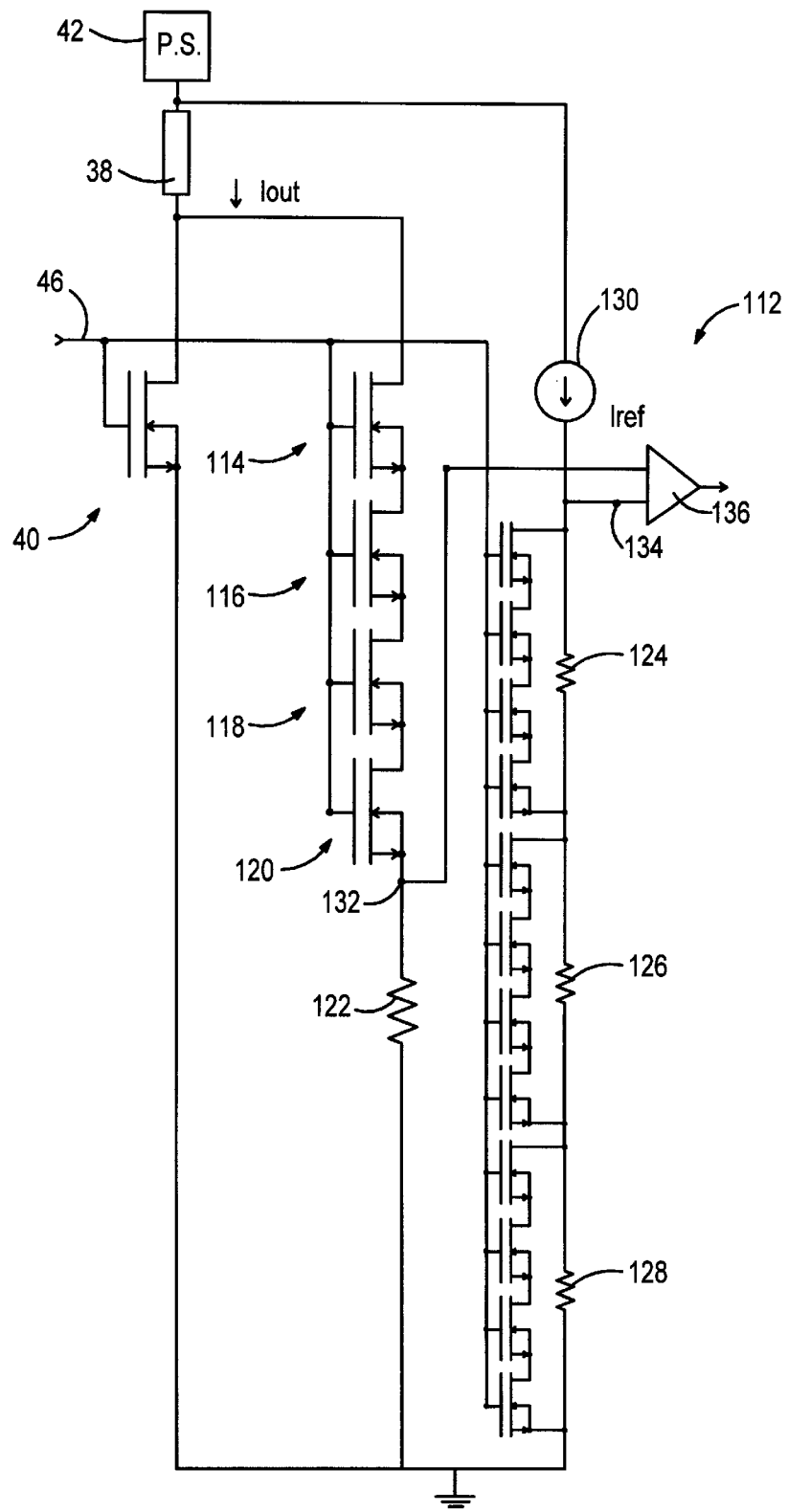
FIG. 5 is a schematic view of a third embodiment that incorporates the features of the first and second embodiments of FIGS. 3 and 4.

FIG. 5 illustrates a combination of the techniques of FIGS. 3 and 4. Again, the reference numerals of the circuit load 38, the power switch 40, the power supply 42 and the gate input line 46 have been duplicated. The current sense circuit 112 of FIG. 5 includes pilot circuitry having four pilot switches 114, 116, 118 and 120 and a pilot resistor 122. Thus, NP=4. The reference circuitry includes three reference resistors 124, 126 and 128 with each resistor being in parallel with a number of reference switches that corresponds to the number of pilot switches. Thus, n=3. The current requirements of a current generator 130 are reduced such that Iref is equal to the current through the power switch 40 divided by the product of SF×n×NP. For example, if SF=2000, n=3, and NP=4, then Iref=Iout/24,000 when the sense voltage at a first node 132 is equal to a reference voltage at a second node 134. The first and second nodes are connected to a differential amplifier 136.

Utilizing the combined techniques as illustrated in FIG. 5 enables power dissipation to be reduced by orders of magnitude. Known fabrication approaches impose a limitation to the scaling factor SF while maintaining the integrity of current tracking. However, by utilizing multiple pilot switches and by designing the circuit such that n>1, power dissipation is reduced without jeopardizing the integrity of the current sense operation.

The operation of a current sense circuit in which SF>1, NP=1, and n>1 will be described with reference to FIG. 6. The current sense circuit 138 includes a first current generator 140 connected to the drains of a power transistor 142 and a pilot transistor 144. The gate width of the pilot transistor 144 is designated as being equal to "1," while the gate width of the power transistor 142 is designated as being equal to "m." The parameter "m" corresponds to SF. The impedance of the power transistor is Rds, so that the impedance of the pilot transistor is mRds.

A pilot resistor 146 is connected between the source of the pilot transistor 144 and electrical ground. A voltage at a first node 148 will therefore correspond to the sense current through the pilot resistor 146. The voltage drop across the pilot resistor is the Vpilot input to a differential amplifier 150. The second input to the differential amplifier is responsive to a current Iref provided by a second current generator 152. The second current generator is connected to electrical ground via a transistor-resistor parallel arrangement that includes at least two reference transistors 154 and a comparable reference resistance 156. Consequently, the voltage Vref at the second input of the differential amplifier depends upon the electrical characteristics of the transistor-resistor parallel arrangement.

Figure 6:
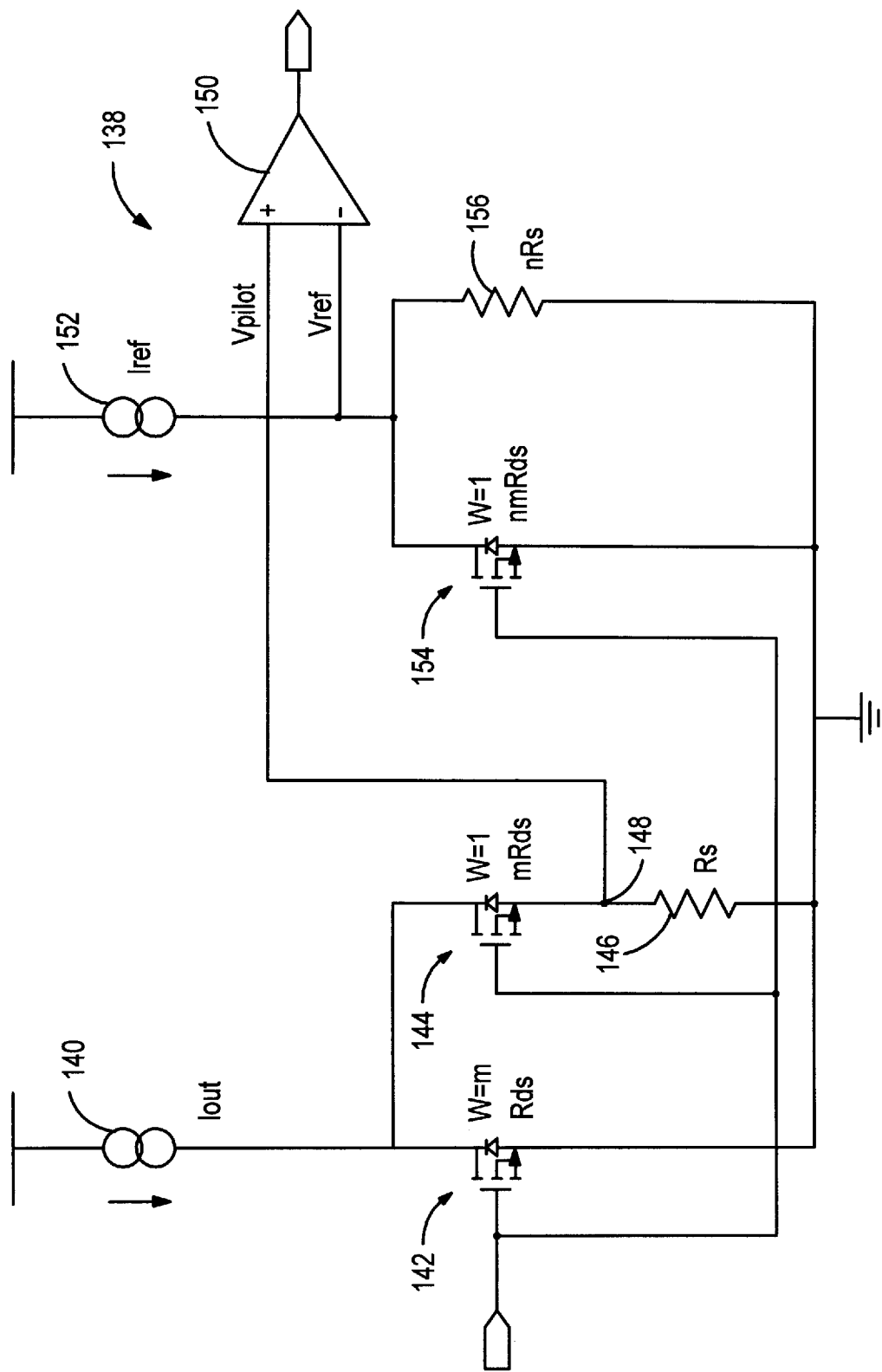
FIG. 6 is a schematic view of a general application of the embodiment of FIG. 3.

For the current sense circuit of FIG. 6, Vpilot may be calculated using techniques well known in the art. Specifically, $$V\text{pilot} = \frac{Iout \times RsRds}{(m+1)Rds + Rs} \quad (1)$$

In like manner, the reference voltage Vref may be calculated as follows:

$$Vref = Iref \times \frac{nmRdsRs}{mRds + Rs} \quad (2)$$

When the two inputs to the differential amplifier 150 are equal, Vpilot=Vref. Under such a condition, $$Iout = Iref \times n \times m \times \frac{(m+1)Rds + Rs}{mRds + Rs} \quad (3)$$

Since the scaling factor SF is large, the parameter "m" is large and "m+1" can be reduced to "m." Therefore, Iout= Iref×n×m.

Figure 7:
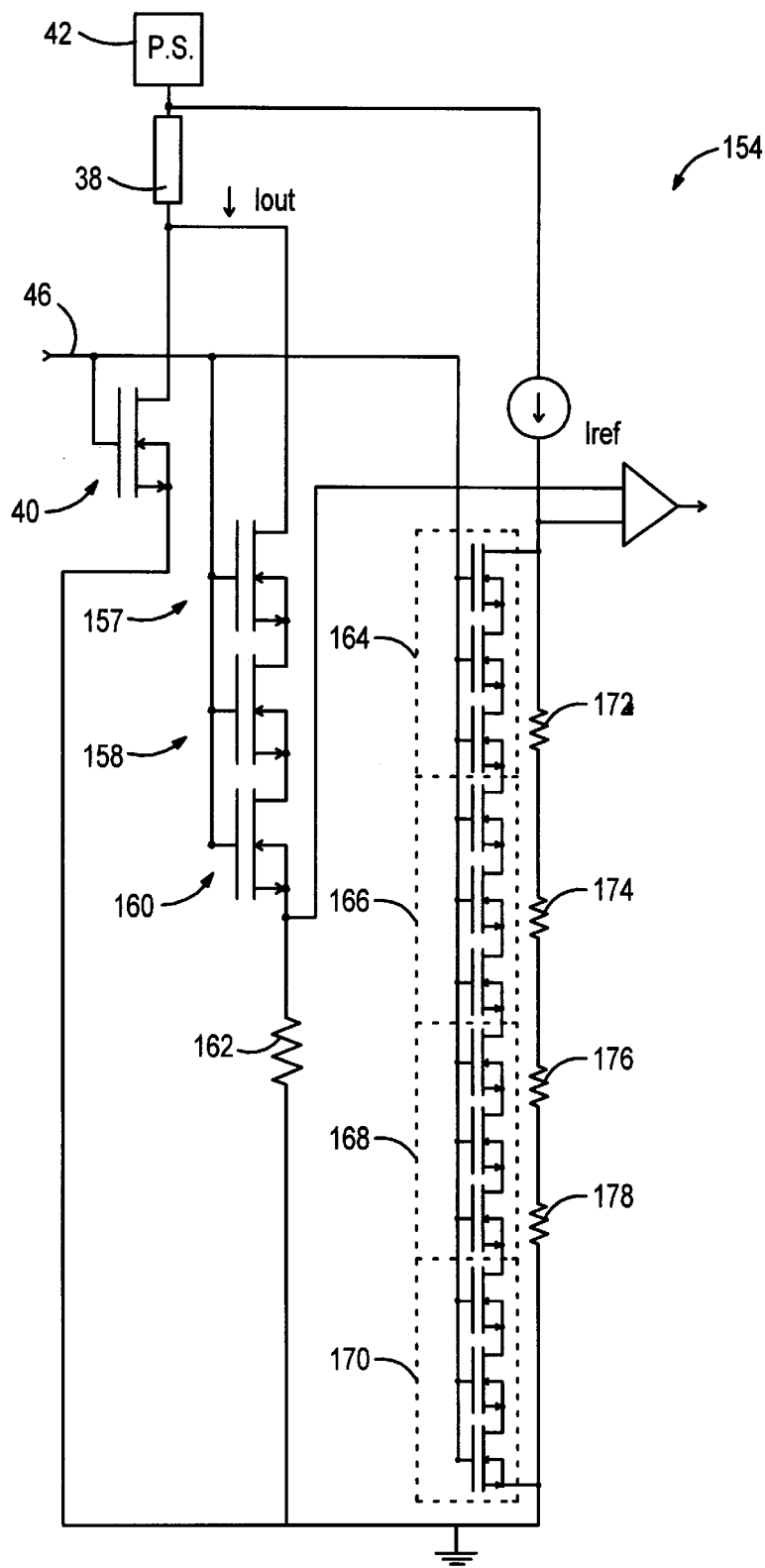
FIG. 7 is a second example of the embodiment of FIG. 5.

Referring now to FIG. 7, an embodiment is shown in which NP=3 and n=4. When Vpilot=Vref and SF=2000, then Iref=Iout/(3×4×2000)=Iout/24,000.

The current sense circuit 154 of FIG. 7 includes three pilot transistors 157, 158 and 160 and a pilot resistor 162. The reference circuitry includes four clusters 164, 166, 168 and 170 of reference transistors. Each cluster is a duplication of the three pilot transistors. The reference circuitry also includes four reference resistors 172, 174, 176 and 178. Each of the reference resistors has a resistance equivalent to the resistance of the pilot resistor 162. Optionally, the four resistors 172–178 may be replaced with a single resistor that has a resistance that is four times that of the pilot resistor. However, the preferred embodiment includes four reference resistors, as shown in FIG. 7, since this embodiment promotes linearity.

The current gain of the circuit of FIG. 7 can be further increased by increasing any or all of NP, n and SF. An increase in NP from 3 to 4 would require a fourth pilot transistor and a fourth reference transistor to each of the four clusters 164–170 of the reference transistors. An increase in n from 4 to 5 would require a fifth transistor cluster 164–170 and a fifth reference resistor 172–178 in electrical series with the reference circuitry shown in FIG. 7.

What is claimed is:

1. A current sense circuit comprising:
a voltage source having first and second terminals;
a load connected to said first terminal of said voltage source;
power switching circuitry for regulating conduction through said load, said power switching circuitry including a resistive power switch connected to establish a first current path between said load and said second terminal of said voltage source;
current pilot circuitry having at least one resistive pilot switch and a pilot resistance connected in electrical series to establish a second current path between said load and said second terminal, said first and second current paths having electrical characteristics such that sense current through said second current path is at a generally fixed fraction of load current through said first current flow path;
reference circuitry including current means for establishing a reference current and including at least two resistive reference switches in electrical series to form a third current path between said current means and said second terminal of said voltage source, said reference circuitry further including a resistive path in electrical parallel with said third current path, said reference switches each having electrical characteristics that are substantially related to electrical characteristics of said pilot switch; and
means for controlling said power switching circuitry in response to said sense current.

2. The current sense circuit of claim 1 wherein said resistive path of said reference circuitry has a resistance that is substantially equal to a multiple (n) of said pilot resistance, where n is equal to the ratio of reference switches to pilot switches.

3. The current sense circuit of claim 2 wherein said pilot and reference switches are MOS transistors having gates connected to a common switch control signal, said reference resistance path being a plurality of resistors, each having substantially the same resistance as said pilot resistance.

4. The current sense circuit of claim 1 wherein said current pilot circuitry includes a number of pilot switches that is proportionally related to the number of said reference switches.

5. The current sense circuit of claim 4 wherein said resistive path of said reference circuitry is a single resistor in parallel with said series connection of said reference switches.

6. The current sense circuit of claim 4 wherein said resistive path of said reference circuitry includes a separate reference resistor in parallel with each of said reference switches.

7. The current sense circuit of claim 1 wherein said pilot switch is a first MOS transistor having a first gate geometry, said power switch being a second MOS transistor having a second gate geometry substantially larger than said first gate geometry by a scaling factor SF, thereby determining said generally fixed fraction of sense current to load current.

8. The current sense circuit of claim 7 wherein reference switches are third MOS transistors having said first gate geometry, each of said first and second MOS transistors having a gate connected to a single switch control signal.

9. The current sense circuit of claim 1 wherein said means for controlling said power switching circuitry includes a differential amplifier having first and second inputs, said first input being connected to a junction of said pilot switch and said pilot resistance, said second input being connected to a junction of said current means and said third current path.

10. A current sense circuit comprising:
a circuit load;
a power transistor having a first source-drain conduction path for conducting current from said circuit load, said power transistor having a first geometry;
a pilot transistor having a second source-drain conduction path for conducting current from said circuit load, said pilot transistor having a second geometry distinguishable from said first geometry such that a current through said pilot transistor is scaled relative to current through said power transistor;
a pilot resistance connected at a first differential input node to said pilot transistor on a side of said second source-drain conduction path opposite to said circuit load;
a current generator having reference output of a reference current;
a plurality of reference transistors having third source-drain conduction paths connected in electrical series to form a path from a second differential input node at said reference output of said current generator;

at least one reference resistor in parallel with said third source-drain conduction path of at least one of said reference transistors; and a differential amplifier having first and second inputs connected to said first and second differential input nodes, respectively and having an output that is responsive to electrical characteristics at said first and second inputs.

11. The current sense circuit of claim 10 wherein said power, pilot and reference transistors have gate terminals connected to a single source of a switch control signal.

12. The current sense circuit of claim 10 wherein said power transistor and said pilot resistance are connected to electrical ground, said load circuit and said current generator being connected to a voltage source.

13. The current sense circuit of claim 10 wherein said first geometry is distinguishable from said second geometry with respect to transistor gate widths, said power transistor having a gate width that is greater than a gate width of said pilot transistor by a scaling factor (SF), a current level (Iref) at said second differential input node thereby being at least as great as a current level (Iout) through said power transistor divided by a product of said scaling factor and a ratio (n) of reference transistors to pilot switches, such that Iref=Iout/(SF×n).

14. The current sense circuit of claim 13 further comprising a plurality of said pilot transistors having second source-drain conduction paths connected in series, said current level at said second differential input node thereby being generally equal to said current level through said power transistor divided by a product of said scaling factor, said ratio (n) and the number of pilot transistors (NP), such that Iref=Iout/(SF×n×NP).

15. A current sense circuit comprising:

a voltage supply having first and second terminals;

a circuit load connected to said first terminal, said circuit load having an output current (Iout);

a power transistor having a main conduction path from said circuit load to said second terminal and having a gate terminal connected to a source of a control signal, said power transistor having a first gate width;

a plurality (NP) of pilot transistors having main conduction paths that are connected in series from said circuit load, each pilot transistor having a second gate width less than said first gate width by a first scaling factor (SF);

a pilot resistance connected at a first node between said pilot transistors and said second terminal;

a current generator connected to said first terminal for generating a reference current (Iref) at a second node;

a plurality of reference transistors having main conduction paths that are connected in series from said second node to said second terminal and in parallel with a reference resistance, wherein the number of reference transistors is a multiple (n) of NP where n is equal to or greater than one, said reference and pilot transistors having gates connected to said source of said control signal; and differential means for determining a voltage difference between voltages developed at said first and second nodes.

16. The current sense circuit of claim 15 wherein said power, pilot and reference transistors are connected such that Iref is generally equal to Iout/(SF×NP×n).

17. The current sense circuit of claim 15 wherein said differential means has an output connected to control said source of said control signal.

18. The current sense circuit of claim 17 wherein said differential means is a differential amplifier.

* * * * *